(12) United States Patent
Nowka et al.

(10) Patent No.: US 6,404,235 B1
(45) Date of Patent: Jun. 11, 2002

(54) SYSTEM AND METHOD FOR REDUCING LATENCY IN A DYNAMIC CIRCUIT

(75) Inventors: Kevin J. Nowka, Round Rock; Hung Cai Ngo; Jieming Qi, both of Austin, all of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/651,959

(22) Filed: Aug. 31, 2000

(51) Int. Cl.$^7$ ............................................. H03K 19/096
(52) U.S. Cl. ........................................... 326/96; 326/95
(58) Field of Search ............................ 326/96, 98, 83, 326/87

(56) References Cited

U.S. PATENT DOCUMENTS 4,700,086 A * 10/1987 Ling et al. ..................... 326/25
5,646,557 A * 7/1997 Runyon et al. ................ 326/97

* cited by examiner

Primary Examiner—Michael Tokar
Assistant Examiner—Daniel D. Chang

(74) Attorney, Agent, or Firm—Casimer K. Salys; Bracewell & Patterson, L.L.P.

(57) ABSTRACT

A dynamic circuit having reduced dynamic node switching latency. The operating status of the dynamic circuit alternates between a pre-charge phase in which a pre-charge device charges the dynamic node, and an evaluation phase in which data at the input of the dynamic circuit may or may not precipitate a dynamic node discharge. Each evaluation phase may be characterized as including an initial standby interval prior to the evaluation discharge, followed by an evaluate interval over which the dynamic node completes an evaluation discharge. A standby device is utilized to drive an output of the dynamic circuit low during a pre-charge phase and to maintain the output low during an standby interval in which dynamic circuit inputs do not result in the dynamic node being discharged. The dynamic circuit includes a standby control circuit that disables the standby device during the evaluation interval, resulting in reduced dynamic node switching capacitance. The dynamic circuit may further include a keeper device connected in parallel with the pre-charge device, wherein the keeper device maintains the dynamic node charged during the standby interval of an evaluation phase. A keeper control circuit responds to receipt of a control signal from the standby control circuit by disabling the keeper device during the evaluate interval such that switching latency is further reduced.

13 Claims, 2 Drawing Sheets

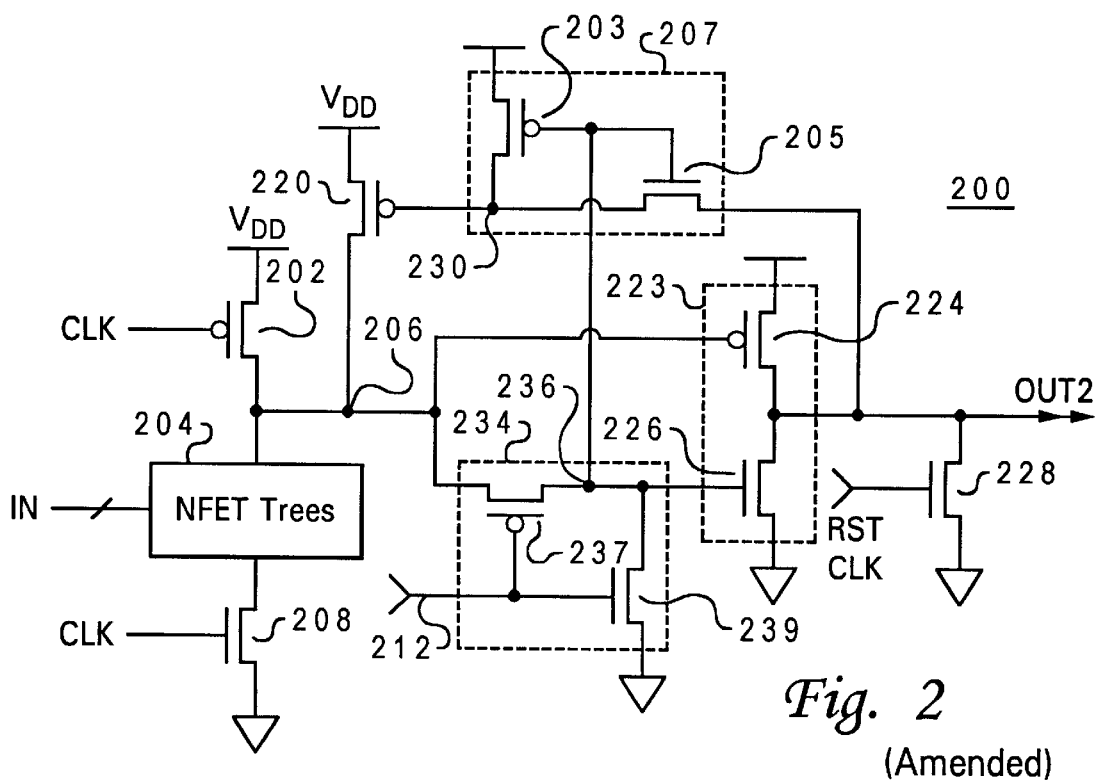
*Fig. 2*
(Amended)

SYSTEM AND METHOD FOR REDUCING LATENCY IN A DYNAMIC CIRCUIT

BACKGROUND OF THE INVENTION

1. Technical Field

The present invention relates in general to dynamic circuits and, in particular to dynamic logic circuits that include so-called keeper circuits for inhibiting noise-induced and leakage-induced failures. More particularly, the present invention relates to a system and method for reducing switching latency in dynamic logic circuits by minimizing the capacitance and the charge source conflict on the pre-charge node of a dynamic logic circuit.

2. Description of the Related Art

Electronic logic circuits generally fall under one of two categories: static or dynamic. Static circuits include elements that, once set to one of the two binary logic states, will remain in that state indefinitely, until the elements are reset to another state or power is removed from the circuit. Dynamic circuits, on the other hand, include elements that represent the binary logic state to which they are set by dynamically switching a pre-set logic state on a dynamic node.

Since the charge stored within a dynamic circuit dissipates within a few milliseconds, a dynamic logic circuit must include a circuit for precharging the charge storing device at a sufficiently small time interval so that it maintains its logic state prior to a resetting to a different logic state. In accordance with interval timing signals, which are generated by a suitable external clock circuit, in a typical dynamic logic circuit, the charge is delivered and stored during a pre-charge phase and then conditionally discharged during an evaluation phase.

Defective components, charge leakage, electrical noise, and other factors can cause logic circuits to fail, i.e., to produce erroneous results. Dynamic logic is particularly susceptible to failure because any of a large number of leakage and noise mechanisms can undesirably degrade or destroy the stored charge. As described below, so-called weak feedback or "keeper" circuits have been developed to inhibit noise-induced failures in dynamic logic.

As illustrated in FIG. 1, a dynamic logic circuit 100 of the type known in the art as a domino circuit includes a pre-charge device such as P-type field effect transistor (PFET) 102. The gate terminal of PFET 102 is connected to a clock signal input, CLK. The source terminal of PFET 102 is connected to a supply voltage, $V_{DD}$, and the drain terminal of PFET 102 is connected to a logic network 104 at a dynamic node 106. Logic network 104 typically includes a network of one or more N-type field effect transistors (NFETs) that are source-to-drain connected so as to implement any suitable logic gate function.

Logic network 104 also receives one or more other input signals, IN, that are connected to the gates of the NFETs within logic network 104, which, depending on the topology of its internal NFET network, define the conditions under which logic network 104 discharges dynamic node 106 through an isolation NFET 108. The source terminals of the bottom NFETs of logic network 104 are connected to the drain terminal of isolation NFET 108. As illustrated in FIG. 1, NFET 108 has a clock signal, CLK, applied to its gate terminal and ground (i.e., zero volts with respect to $V_{DD}$) applied to its source terminal. It is through isolation NFET 108 that logic network 104 discharges dynamic node 106.

As further illustrated in FIG. 1, a PFET 120 charges dynamic node 106 while output OUT1 is at a logic low. In this configuration, PFET 120 acts to protect dynamic node 106 from noise-induced and leakage-induced faults, and is known as a "keeper" device. The source terminal of PFET 120 is connected to $V_{DD}$ while its drain is connected to logic network 104 at dynamic node 106. During the initial portion of an evaluation phase and prior to arrival of new data at IN, OUT1 remains at a logic low state thus enabling PFET 120 to provide charge maintenance at dynamic node 106.

Leakage and noise mechanisms that may adversely affect the performance of dynamic logic circuit 100 may include capacitive coupling to adjacent signals, charge sharing, sub-threshold conduction through NFET logic transistors within logic network 104, and conduction through the NFET logic transistors due to noise on the inputs. If enough of the charge stored on dynamic node 106 is lost due to one or more of these mechanisms, OUT1 may transition to an incorrect state. This error can propagate to other gates (not shown) to which dynamic logic circuit 100 may be coupled and cause erroneous results. To inhibit such charge loss on dynamic node 106, PFET 120 functions as a feedback device to feed back charge to dynamic node 106.

Although the inclusion of a weak feedback circuit in dynamic logic circuit 100 addresses the charge loss problem, it adversely affects the performance of dynamic logic circuit 100 in terms of switching speed. An "evaluation phase" of operation within dynamic logic circuit 100 is initiated by a rising edge of CLK (see FIG. 3). If, during an evaluation phase, an evaluation results in a discharge, logic network 104 not only must discharge dynamic node 106, but it must also counteract the charge supplied by PFET 120, thus increasing the time required to discharge dynamic node 106. It is not until OUT1 reaches a sufficiently high level to switch PFET 120 off, that PFET 120 stops conducting, and this delay can adversely affect the operating speed of any circuit that includes dynamic logic circuit 100.

As illustrated in FIG. 1, dynamic logic circuit 100 further includes an inverter 122 that is a complementary metal oxide semiconductor (CMOS) device which includes PFET 124 and an NFET 126. NFET 126 is sometimes referred to as a "standby" device and is responsible for driving OUT1 low during a pre-charge phase of operation. However, this action of NFET 126 is in conflict with the pull-up action of PFET 124 during the evaluation phase when the logic state at OUT1 is rising and turning off PFET 120. In addition, the gate capacitance of NFET 126 increases the total capacitance of dynamic node 106 which holds a charge that must be discharged (switched) during each evaluation cycle. Standby NFET 126 thus introduces additional switching delay to a data evaluation in addition to that caused by keeper PFET 120 as described above.

In order to minimize the delay caused by standby NFET 126, a designer must consider the tradeoff between the potential impact on performance of providing a minimal sized NFET 126 and the potential impact on reliability of not providing a sufficiently robust NFET 126.

It would therefore be desirable to provide a dynamic circuit that optimizes performance by reducing both of the above-mentioned conflicting conditions, while maintaining reliable operation. These problems are satisfied by the present invention in the manner set forth hereinbelow.

SUMMARY OF THE INVENTION

A dynamic circuit having a reduced dynamic node switching latency is disclosed herein. The operating status of the dynamic circuit alternates between a pre-charge phase in which a pre-charge device charges the dynamic node, and an evaluation phase in which the dynamic node is conditionally discharged in accordance with NFET tree inputs. Each evaluation phase may be characterized as including an initial standby interval during which an isolation device is activated but NFET tree inputs have not arrived. Following the standby interval within an evaluation phase is an evaluate interval during which NFET tree inputs may arrive. The standby interval is followed by an evaluate interval in which in response to valid NFET tree inputs, the dynamic node may complete an evaluation discharge. A standby device is utilized to drive an output of the dynamic circuit low during a pre-charge phase and to maintain the output low during a standby interval in which NFET tree inputs do not result in the dynamic node being discharged. The dynamic circuit includes a standby control circuit that disables the standby device during the evaluation interval, resulting in reduced dynamic node switching capacitance. The dynamic circuit may further include a keeper device for maintaining the dynamic node charged during the standby interval of an evaluation phase. A keeper control circuit disables said keeper device during the evaluate interval such that switching latency is further reduced.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 2 is a schematic diagram illustrating a dynamic circuit in which keeper and standby controls have been incorporated in accordance with a preferred embodiment of the present invention.

DETAILED DESCRIPTION OF THE PREFERRED EMBODIMENT

Figure 1:
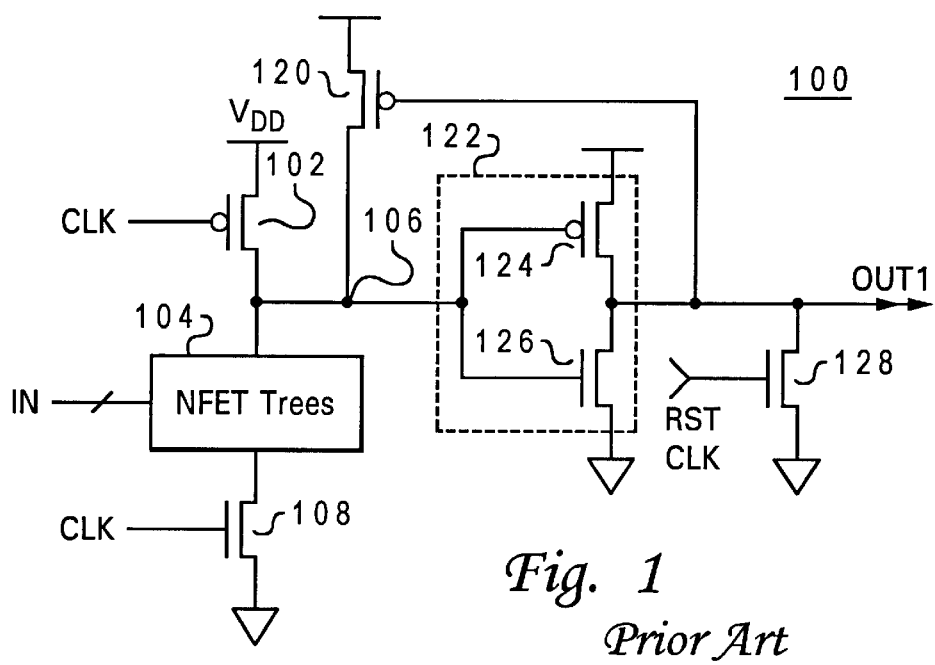
FIG. 1 is a schematic diagram illustrating a prior art dynamic logic circuit utilizing conventional keeper and standby systems.

This invention is described in a preferred embodiment in the following description with reference to the figures, in which like numbers represent the same or similar elements. While this invention is described in terms of the best mode for achieving this invention's objectives, it will be appreciated by those skilled in the art that variations may be accomplished in view of these teachings without deviating from the spirit or scope of the present invention.

With reference to FIG. 2, there is depicted a dynamic circuit 200 in which keeper and standby controls have been incorporated in accordance with a preferred embodiment of the present invention. In particular, dynamic circuit 200 includes a standby control circuit 234 and a keeper control circuit 207 that reduce the switching latency experienced on a dynamic node 206 and an output node OUT2 during an evaluation discharge. As illustrated in FIG. 2, dynamic logic circuit 200 includes an NFET 226 and a PFET 224 that form a modified inverter 223 through which a logic level at dynamic node 206 is inverted at OUT2.

Figure 3:
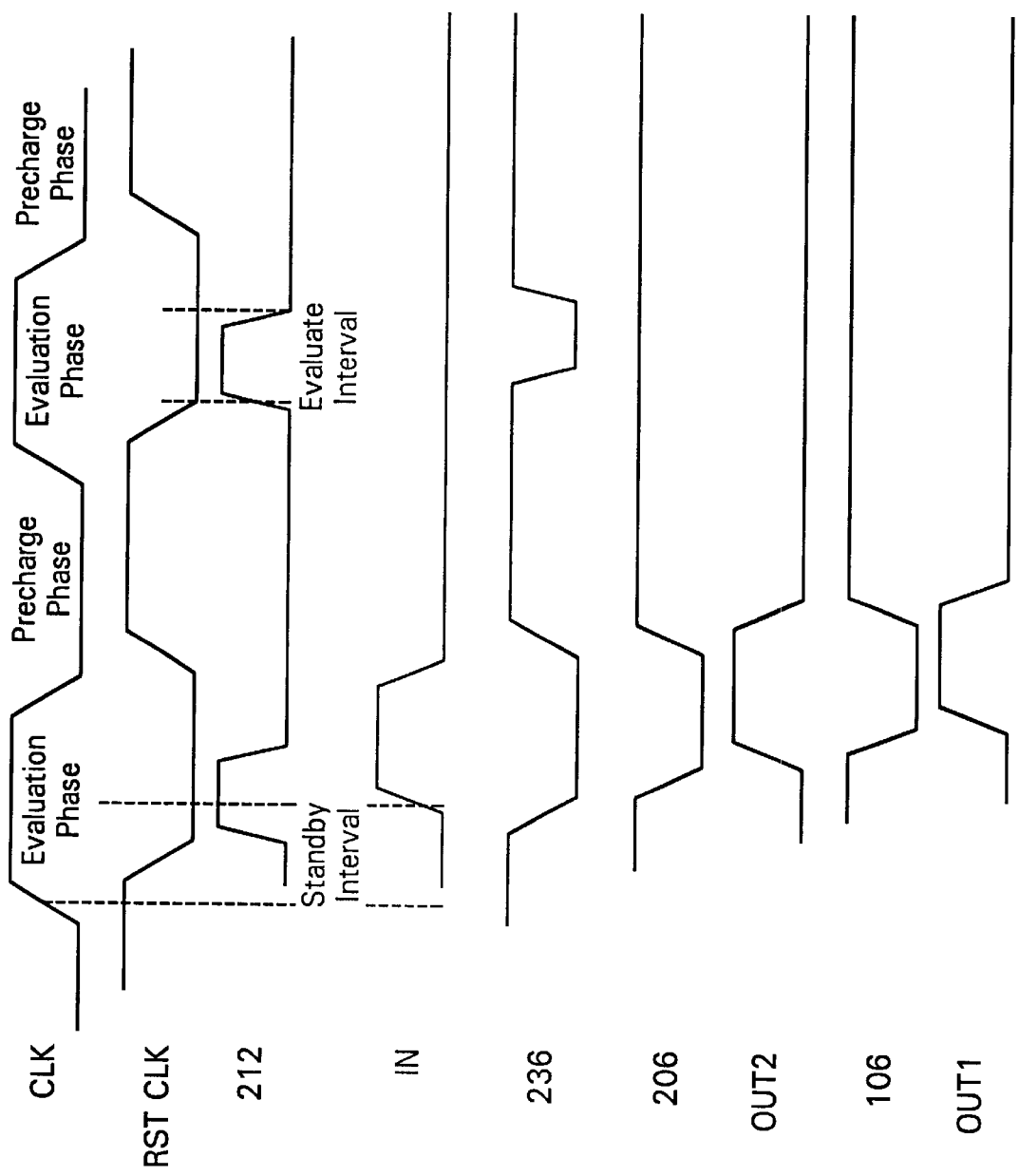
FIG. 3 is a timing diagram illustrating state waveforms for a latency-enhanced dynamic circuit, in accordance with a preferred embodiment of the present invention.

The operating status of dynamic circuit 200 alternates between a pre-charge phase in which a pre-charge PFET 202 charges the dynamic node, and an evaluation phase during which pre-charge PFET 202 is disabled and in which data at an input IN of dynamic circuit 200 may or may not precipitate a dynamic node discharge (see FIG. 3). Each evaluation phase may be characterized as including an initial standby interval preceding an evaluation and possible discharge off dynamic node 206, followed by an evaluate interval over which dynamic node 206 completes the evaluation which may or may not result in a discharge.

Keeper control circuit 207 and standby control circuit 234 address two major sources of switching latency experienced by conventional dynamic logic devices such as dynamic logic circuit 100. The first potential source of switching latency within dynamic logic circuit 200 comes from within the pre-charge circuitry which, in the depicted embodiment, includes pre-charge PFET 202 and a keeper PFET 220. As in the conventional circuit illustrated in FIG. 1, dynamic logic circuit 200 includes a clock input, CLK, applied to pre-charge PFET 202 and an isolation NFET 208. Keeper PFET 220 charges dynamic node 206 prior to an arrival of a next data input at IN. As explained in greater detail hereinbelow, keeper PFET 220 is disabled during the evaluate interval of an evaluation phase by keeper control circuit 207 in response to the voltage levels at a standby control node 236 and OUT2.

A second potential source of added switching latency within dynamic logic circuit 200 comes from the operation of a standby NFET 226. As shown in the depicted embodiment, a pull-up PFET 224 is source-to-drain connected to standby NFET 226 to form an inverter that connects dynamic node 206 to OUT2. NFET 226 is responsible for driving OUT2 low during a pre-charge phase of operation, and also for maintaining a low output during an evaluation phase in which data inputs, IN, do not precipitate an evaluation discharge of dynamic node 206 (see FIG. 3). In addition, the gate capacitance of NFET 226 is removed from dynamic node 206 such that the total switching capacitance is reduced during an evaluation discharge.

In accordance with conventional dynamic circuit operating principles, pre-charge PFET 202 is switched on and pre-charges dynamic node 206 to a binary logic high state during a pre-charge phase of CLK (see FIG. 3). As seen in the state waveform diagram of FIG. 3, an evaluation phase begins at a rising edge of CLK. Depending on data input, IN, and the logic implemented by logic network 204, any such evaluation phase may or may not result in an evaluation discharge on dynamic node 206.

At the onset of an evaluation phase, dynamic node 206 will either remain at a binary logic high state or will discharge to a binary logic low state through logic network 204 and isolation NFET 208 depending upon the logic states of the logic inputs IN and the logic function implemented by logic network 204. Following each evaluation phase, dynamic node 206 is again pre-charged (see FIG. 3).

As utilized herein "standby" refers to an operating condition within dynamic logic circuit 200 in which CLK is high (evaluate phase) prior to commencement of an evaluation discharge of dynamic node 206. As depicted in the state waveform diagram in FIG. 3, a standby interval is definable from the rising edge of CLK (i.e., the beginning of an evaluation phase) until the rising edge of a data input IN that causes dynamic node 206 to begin discharging.

A disable signal transitions from low to high on an input 212 of a standby control circuit 234 during the evaluation interval. A further characterization of the disable signal applied to input 212 is illustrated in the state waveform diagram of FIG. 3. In response to the low to high transition of the disable signal on input 212, standby control circuit prevents standby NFET 226 from resisting the pull-up action of pull-up PFET 224 at OUT2 during an evaluation discharge on dynamic node 206. In addition the gate-to-source capacitance of standby NFET 226 is decoupled from dynamic node 206 thus reducing the switching latency during an evaluation discharge.

As further depicted in FIG. 2, standby control circuit 234 comprises a pair of transistors, PFET 237 and NFET 239, that receive the disable signal from input 212 and, in response thereto, produce a switching control output applied to the gate of standby NFET 226 at standby control node 236. A reset clock signal, RST CLK, is applied to a reset NFET 228 for restoring output node OUT2 following an evaluate interval in which dynamic node 206 is discharged.

As illustrated in FIG. 3, in response to a low-to-high transition of CLK, the disable signal applied at input 212 transitions from low to high. In an important feature of the present invention, this transition of the disable signal results in PFET 237 being switched off, or disabled, thus isolating standby NFET 226 from dynamic node 206. The disablement of PFET 237 and resulting isolation of NFET 226 disconnects the gate capacitance of standby NFET 226 from dynamic node 206, thus allowing faster evaluation switching on dynamic node 206 and OUT2. While disabling PFET 237, the high disable signal at input 212 enables NFET 239, which then pulls standby control node 236 low (see FIG. 3). In response to standby control node 236 going low, standby NFET 226 switches to a logic low in anticipation of OUT2 switching logic states.

As further depicted in the embodiment in FIG. 2, keeper control circuit 207 includes PFET 203 and NFET 205 that share a common control input at standby control node 236 and are source-to-drain connected at node 230. In response to standby control node 236 being driven low during an evaluate interval as previously described, NFET 205, is disabled, thus disconnecting the gate capacitance of keeper PFET 220 from OUT2. This selectable removal of the gate capacitance of keeper PFET 220 from OUT2 enhances the pull-up (switching) speed of OUT2. A logic low state on standby control node 236 enables PFET 203 which, in turn, pulls up a keeper control node 230. The logic high on keeper control node 230 disables keeper PFET 220, thus further improving evaluation switching speed.

In an important feature of the present invention, keeper control circuit 207 provides switching control feedback from dynamic node 206 to the gate (controlling terminal) of keeper PFET 220, such that keeper PFET 220 is disabled during the evaluate interval. In this manner PFET 220 performs its feedback function during the standby interval while not interfering with the pull-down of dynamic node 206 during an evaluate interval.

It should be noted with reference to the timing diagram illustrated at FIG. 3, that the condition in which dynamic node 206 is required to remain at a binary logic high during an evaluate phase in which no data is pulling dynamic node 206 down, is satisfied when CLK is high, and a reset assist input RST CLK and delayed reset input 212 are both low. As a result, and considering the timing diagram of FIG. 3 in conjunction with dynamic logic circuit 200, PFETs 237 and 220, and NFETs 226 and 205, are switched on while PFETs 224 and 203, and NFET 239 are off.

In addition to providing standby switching control for standby NFET 226, standby control circuit 234 assists keeper control circuit 207 in synchronizing switching control of PFET 220. A high standby control signal applied from a standby control node 236 via PFET 237 activates NFET 205 to pass a logic low from OUT2 to a keeper control node 230. Therefore, keeper PFET 220 is conducting and charging dynamic node 206 to maintain a logic high during standby.

Referring now to FIG. 3, there is depicted a timing diagram illustrating state waveforms for a latency enhanced dynamic circuit in accordance with a preferred embodiment of the present invention. Specifically, the waveforms within the timing diagram of FIG. 3 include a comparison of the switching timing at the output node of dynamic circuit 200. As seen in FIG. 3, along with a pre-charge phase, CLK includes an evaluate phase wherein an evaluate interval and standby interval as described with reference to FIG. 2 are illustrated.

While the invention has been particularly shown and described with reference to a preferred embodiment, it will be understood by those skilled in the art that various changes in form and detail may be made therein without departing from the spirit and scope of the invention.

What is claimed is:

1. A dynamic logic circuit having reduced switching latency on a dynamic node and an output node comprising:
   a standby device for maintaining said output node at a logic low during an evaluation phase in which a data input does not result in an evaluation discharge on said dynamic node; and
   a standby control circuit for isolating said standby device from said dynamic node during an evaluation discharge such that switching latency on said dynamic node and said output node is reduced.

2. The dynamic logic circuit of claim 1, wherein said standby control circuit includes circuit means for preventing said standby device from switching during said evaluation discharge.

3. The dynamic logic circuit of claim 2, wherein the timespan over which said evaluation discharge occurs is characterized as an evaluate interval, and wherein said circuit means for preventing said standby device from switching during said evaluation discharge include a P-type field effect transistor source-to-drain connected to an N-type field effect transistor, wherein said P-type field effect transistor and said N-type field effect transistor share a common input gate node at which a disable signal is received during said evaluate interval.

4. The dynamic logic circuit of claim 1, wherein said standby device is a field effect transistor having an input gate terminal connected to a standby control node within said standby control circuit.

5. The dynamic logic circuit of claim 4, wherein said standby control circuit further comprises a P-type field effect transistor source-to-drain connected to an N-type field effect transistor such that said standby control node is formed at said source-to-drain connection.

6. The dynamic logic circuit of claim 4, wherein said standby control circuit comprises a P-type field effect transistor having a source connected to said dynamic node and a drain connected to the gate of said standby device.

7. The dynamic logic circuit of claim 4, wherein said standby control circuit further comprises an N-type field effect transistor having a source connected to a binary low logic level and a drain connected to the gate of said standby device.

8. The dynamic logic circuit of claim 1, further comprising:

a pre-charge device for charging said dynamic node during said pre-charge phase;

a keeper device connected in parallel with said pre-charge device, wherein said keeper device maintains said dynamic node charged during said standby interval; and a keeper control circuit for disabling said keeper device during an evaluation discharge on said dynamic node.

9. The dynamic logic circuit of claim 8, wherein said keeper control circuit includes a P-type field transistor that is source-to-drain connected to an N-type field effect transistor, and wherein said keeper device is a P-type field effect transistor having a source connected to a binary high logic level, a drain connected to said dynamic node, and a gate connected to the output of said keeper control circuit.

10. The dynamic logic circuit of claim 9, wherein said keeper control circuit comprises:

P-type field effect transistor having a source connected to a binary high logic level, a drain connected to the gate of said pre-charge device, and a gate connected to said dynamic node; and an N-type field effect transistor having a source connected to said output node, a drain connected to the gate of said pre-charge device, and a gate connected to said dynamic node.

11. A dynamic circuit having reduced switching latency on a dynamic node and an output node, said dynamic circuit comprising:

an output inverter coupling said dynamic node to said output node;

a field-effect transistor within said inverter having an input terminal that is selectively coupled to said dynamic node; and a control circuit for selectively decoupling said field-effect transistor input terminal from said dynamic node in response to said control circuit receiving a disable signal, wherein said control circuit includes:

a first field-effect transistor;

a second field-effect transistor that is source-to-drain connected to said first field-effect transistor such that said first and second field-effect transistors form a first complementary pair of transistors having a common gate input at which said disable signal is applied; and a control node connecting the source-to-drain connection of said first complementary pair to an input terminal of said field-effect device.

12. The dynamic circuit of claim 11, further comprising:

a logic network coupled to said dynamic node, wherein said logic network evaluates a data input and conditionally discharges said dynamic node in response thereto;

a pre-charge transistor that conditionally charges said dynamic node in response to a clock signal, wherein said clock signal is characterized by a cycle that includes a pre-charge phase during which said pre-charge transistor charges said dynamic node, and an evaluation phase during which said pre-charge transistor is disabled, wherein said evaluation phase may be divided into an initial standby interval that terminates prior to a possible arrival of a next data input, and an evaluate interval over which said next data input may arrive, wherein said evaluate interval commences upon termination of said standby interval;

a keeper transistor for charging said dynamic node prior to an arrival of a next data input at said logic network; and a keeper control circuit for disabling said keeper transistor during said evaluate interval.

13. The dynamic circuit of claim 12, wherein said control circuit further comprises a second complementary pair of field-effect transistors having a common gate input connected to said source-to-drain connection of said first complementary pair, and a source-to-drain connected output coupled to a control terminal of said keeper transistor.

* * * * *